(12) United States Patent
Chen et al.

(10) Patent No.: US 6,510,088 B2
(45) Date of Patent: Jan. 21, 2003

(54) SEMICONDUCTOR DEVICE HAVING REDUCED LEAKAGE AND METHOD OF OPERATING THE SAME

(75) Inventors: Wei-Fan Chen, Hsinchu (TW); Shi-Tron Lin, Taipei (TW); Chen-Hsin Lien, Hsinchu (TW)

(73) Assignee: Winbond Electronics Corporation, Taiwan (TW)

( * ) Notice: Subject to any disclaimer, the term of this patent is extended or adjusted under 35 U.S.C. 154(b) by 0 days.

(21) Appl. No.: 09/813,806

(22) Filed: Mar. 22, 2001

(65) Prior Publication Data

US 2002/0181291 A1 Dec. 5, 2002

(51) Int. Cl.[7] .................................................. G11C 7/00
(52) U.S. Cl. ................... 365/189.09; 365/154; 365/226
(58) Field of Search ........................... 365/189.09, 226, 365/154, 156; 327/536, 537, 535, 534

(56) References Cited

U.S. PATENT DOCUMENTS

| | | | | |
|---|---|---|---|---|
| 4,904,885 A | * | 2/1990 | Yamada et al. | 327/536 |
| 5,471,421 A | | 11/1995 | Rose et al. | |
| 5,524,095 A | * | 6/1996 | Someya et al. | 365/189.09 |
| 5,708,599 A | * | 1/1998 | Sato et al. | 365/154 |
| 5,781,481 A | | 7/1998 | Iwakiri | |
| 5,880,620 A | * | 3/1999 | Gitlin et al. | 327/534 |
| 5,900,665 A | * | 5/1999 | Tibata | 257/357 |
| 6,061,267 A | * | 5/2000 | Houston | 365/154 |
| 6,115,296 A | * | 9/2000 | Ando | 365/189.09 |

OTHER PUBLICATIONS

Gil et al., "A high speed and low power SOI inverter using active body–bias," Solid–State Electronics (1999), 43:791–799.
Park et al., "Performance Characteristics of SOI DRAM for Low–Power Application," IEEE Journal of Solid–State Circuits (Dec. 1999), 34:1446–1453.
Shimomura et al., "A 1–V 46–ns 16–Mb SOI–DRAM with Body Control Technique," IEEE Journal of Solid–State Circuits (Nov. 1997), 32:1712–1720.
Chung et al., "A New SOI Inverter For Low Power Applications," Proceedings 1996 IEEE International SOI Conference (Oct. 1996), pp. 20–21.
Sakata et al., "Two–Dimensional Power–Line Selection Scheme for Low–Subthreshold–Current Multi–Gigabit DRAM's, " IEEE Journal of Solid–State Circuits (Aug. 1994), 29:887–894.
Sakata et al., "Subthreshold–Current Reduction Circuits for Multi–Gigabit DRAM's," IEEE Journal of Solid–State Circuits (Jul. 1994), 29:761–769.
Kawahara et al., "Subthreshold Current Reduction for Decoded–Driver by Self–Reverse Biasing" IEEE Journal of Solid–State Circuits (Nov. 1993), 28:1136–1144.

* cited by examiner

*Primary Examiner*—David Nelms
*Assistant Examiner*—Gene N. Auduong
(74) *Attorney, Agent, or Firm*—Finnegan, Henderson, Farabow, Garrett & Dunner, L.L.P.

(57) ABSTRACT

The present invention is directed to a semiconductor integrated circuit device having reduced leakage and the method of operating a semiconductor integrated circuit device with reduced leakage. The invention comprises an integrated circuit, including a passing transistor and a bias-application device coupled to the substrate of the passing transistor. The present invention has the passing transistor coupled to a storage cell. The bias-application device applies a first bias voltage of a positive value when the passing transistor is inactivated and applies a second bias voltage when the passing transistor is activated, wherein the second bias voltage is equal to or smaller than the first bias voltage. Further in accordance with the invention, there is provided a method of reducing the leakage of a passing transistor of N-type. The passing transistor is coupled with a storage cell. The method includes applying a first bias voltage of a positive value when the passing transistor is inactivated, and applying a second bias voltage when the passing transistor is activated, wherein the second bias voltage is equal to or smaller than the first bias voltage.

20 Claims, 4 Drawing Sheets

SEMICONDUCTOR DEVICE HAVING REDUCED LEAKAGE AND METHOD OF OPERATING THE SAME

BACKGROUND OF THE INVENTION

A. Field of the Invention

The present invention relates to a semiconductor integrated circuit device, and more specifically, it relates to a semiconductor integrated circuit device having reduced leakage and also to a method of operating a semiconductor integrated circuit device to reduced leakage.

B. Description of the Related Art

Transistors, or more specifically, metal oxide semiconductor field effect transistors ("MOSFETs"), are one of the most important devices in semiconductor integrated circuits. A transistor basically includes a gate and a channel with two ends. By controlling the voltage applied to the gate, the transistor can be used to control the flow of electricity through the channel and thereby turn on or turn off the flow of electric current between the two ends of the channel. For example, an N-type transistor can be turned off by applying no bias at its gate end and can be turned on by applying a voltage higher than the threshold voltage $V_T$ of the transistor. This functional characteristic enables a transistor to be operated and combined with other devices or transistors to form almost a variety of circuits. One example includes coupling a transistor or transistors with a storage cell to operate the reading, writing, or refreshing of a signal stored in the storage cell.

FIG. 1 illustrates the basic structure of a single dynamic random access memory ("DRAM") storage cell. The cell includes a passing transistor 10 and a storage node of a capacitor 12. The gate 10g of the transistor 10 is usually connected to a "word line" of a memory circuit that controls the reading, writing, or refreshing of the signal stored in the capacitor 12. The signal in the capacitor 12 was inputted to or outputted from a "bit-line" ("BL") of the memory circuit through the passing transistor 10. FIG. 2 illustrates the basic structure of a single static random access memory ("SRAM") storage cell that includes two passing transistors 20a and 20b and a storage node consisting of two cross-coupled inverters 22a and 22b. The gates of the transistors 20a and 20b are usually connected the same word line that controls the reading, writing, or refreshing of the signal stored in the SRAM storage cell. The signal in the storage cell is usually communicated with the same bit line through the passing transistors 20a and 20b.

One goal of the continuing development of semiconductor devices is to reduce the feature size of semiconductor devices and thereby reduce the operating power while at the same time increase the operating speed of the devices. A typical transistor operated through a controlling voltage applied to the gate of the transistor usually has a leakage problem that results in the flow of a current through the channel of the transistor even when the transistor is turned off. As the feature size of the transistor becomes smaller and the operating current of devices drops lower, the leakage of the transistor becomes comparatively larger. Typical leakage problems include drain-induced barrier lowing ("DIBL"), gate-induced drain leakage ("GIDL"), P/N junction leakage, subthreshold In the applications of memory devices, leakage problems of their accompanying transistors often impair the performance of the memory devices. Taking SRAM as an example, the leakage of passing transistors increases the power consumption of a memory device and sometimes even affects the data validity of the signal stored in the storage cell. Taking DRAM as another example, the leakage of the passing transistor which keeps drawing current out of the storage cell of a capacitor affects the data validity of the signal stored in the storage cell.

A traditional approach towards solving the leakage problem is to apply a negative bias at the body end, or the substrate end, of an N-type transistor. Applying a negative substrate bias raises the threshold voltage of the N-type transistor and improves the data validity in a storage cell coupled with the transistor. The approach, however, does not work well for very deep submicron devices of a feature size smaller than 2 µm. For those devices, the concentration of the P-well of the N-type transistor is usually larger than $2 \times 10^{18}$ N/cm$^3$ and the increase of the junction leakage between the drain and the body (substrate) of a transistor makes the approach of applying the negative bias infeasible.

In the U.S. Pat. No. 5,781,481, Iwakiri proposed the idea of applying a negative bias on the gate of a passing transistor to reduce leakage solution. The actual implementation of this idea, however, requires the addition of a word-line level-shift circuitry within the limited space of word-line area on an integrated-circuit chip, making this approach difficult to implement in ordinary integrated-circuit chips under the general space limitations.

SUMMARY OF THE INVENTION

Accordingly, the present invention is directed to a semiconductor integrated circuit device having reduced leakage that substantially obviates one or more of the problems due to the limitations and disadvantages of the related art.

The present invention also directed to the method of operating a semiconductor integrated circuit device with reduced leakage that substantially obviates one or more of the problems due to the limitations and disadvantages of the related art.

The invention also discloses a semiconductor integrated circuit device with a bias application device and a method of operation of a semiconductor integrated circuit device that applies a bias to the substrate of a transistor.

One of the advantages of the present invention includes a greater reduction in leakage than conventional operating schemes for transistors. Additional features and advantages of the invention will be set forth in part in the description which follows, and in part will be obvious from the description, or may be learned by practice of the invention. The objectives and other advantages of the invention will be realized and attained by means of the elements and combinations particularly pointed out in the written description and claims hereof, as well as the appended drawings.

To achieve these and other advantages and in accordance with the purpose of the invention, as embodied and broadly described herein, the invention comprises an integrated circuit, including a passing transistor and a bias-application device. The present invention has the passing transistor coupled to a storage cell. The biased-application device is coupled to the substrate of the passing transistor and the storage cell. The bias-application device applies a first bias voltage of a positive value when the passing transistor is inactivated and applies a second bias voltage when the passing transistor is activated, wherein the second bias voltage is equal to or smaller than the first bias voltage. Further in accordance with the invention, there is provided a method of reducing the leakage of the passing transistor of N-type. The passing transistor is coupled with a storage cell.

The method includes the applying a first bias voltage of a positive value when the passing transistor is inactivated, and applying a second bias voltage when the passing transistor is activated, wherein the second bias voltage is equal to or smaller than the first bias voltage.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Integrated circuits usually have at least two supply voltages. The higher voltage of the two supply voltages is typically referred to as $V_{DD}$ and the lower one of the two is typically referred to as $V_{SS}$. Depending on the design and feature size of the circuits, $V_{DD}$ may be varied from 1.0V to 3.3V or 5V and $V_{SS}$ may be 0V or ground, but these particular values are only exemplary of possible values for the supply voltages $V_{DD}$ and $V_{SS}$.

Figure 1:
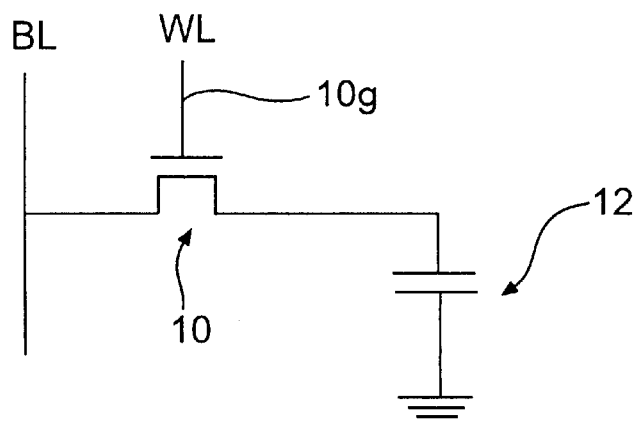
FIG. 1 illustrates the basic structure of a single dynamic random access memory ("DRAM") storage cell in the prior art.
Figure 2:
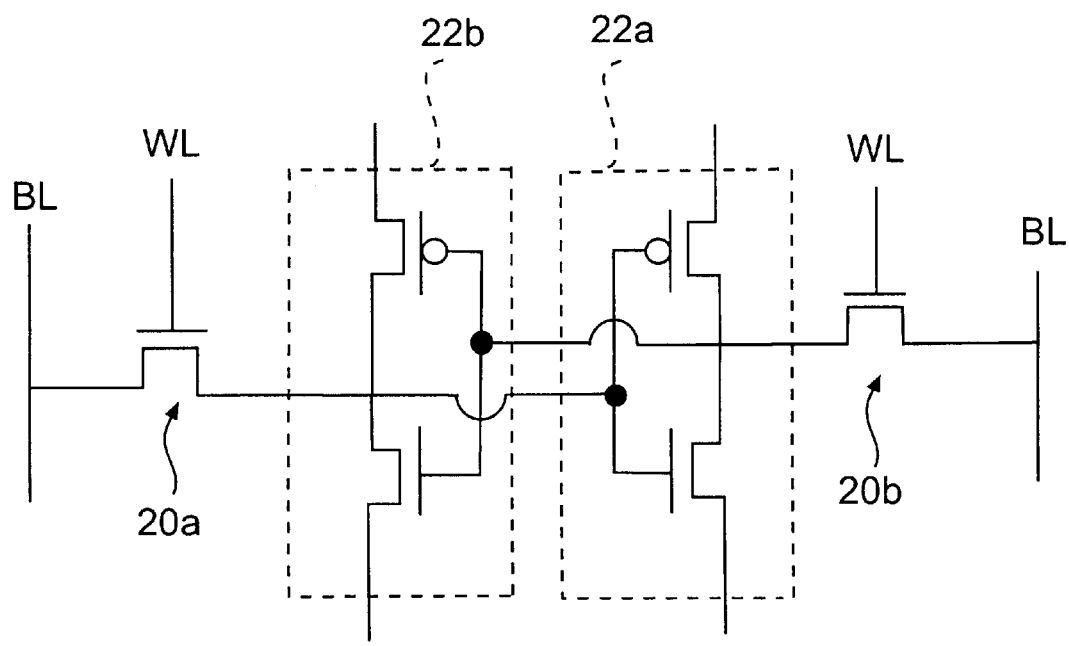
FIG. 2 illustrates the basic structure of a single static random access memory ("SRAM") storage cell that includes two passing transistors and a storage node consisting of two cross-coupled inverters in the prior art.
Figure 3:
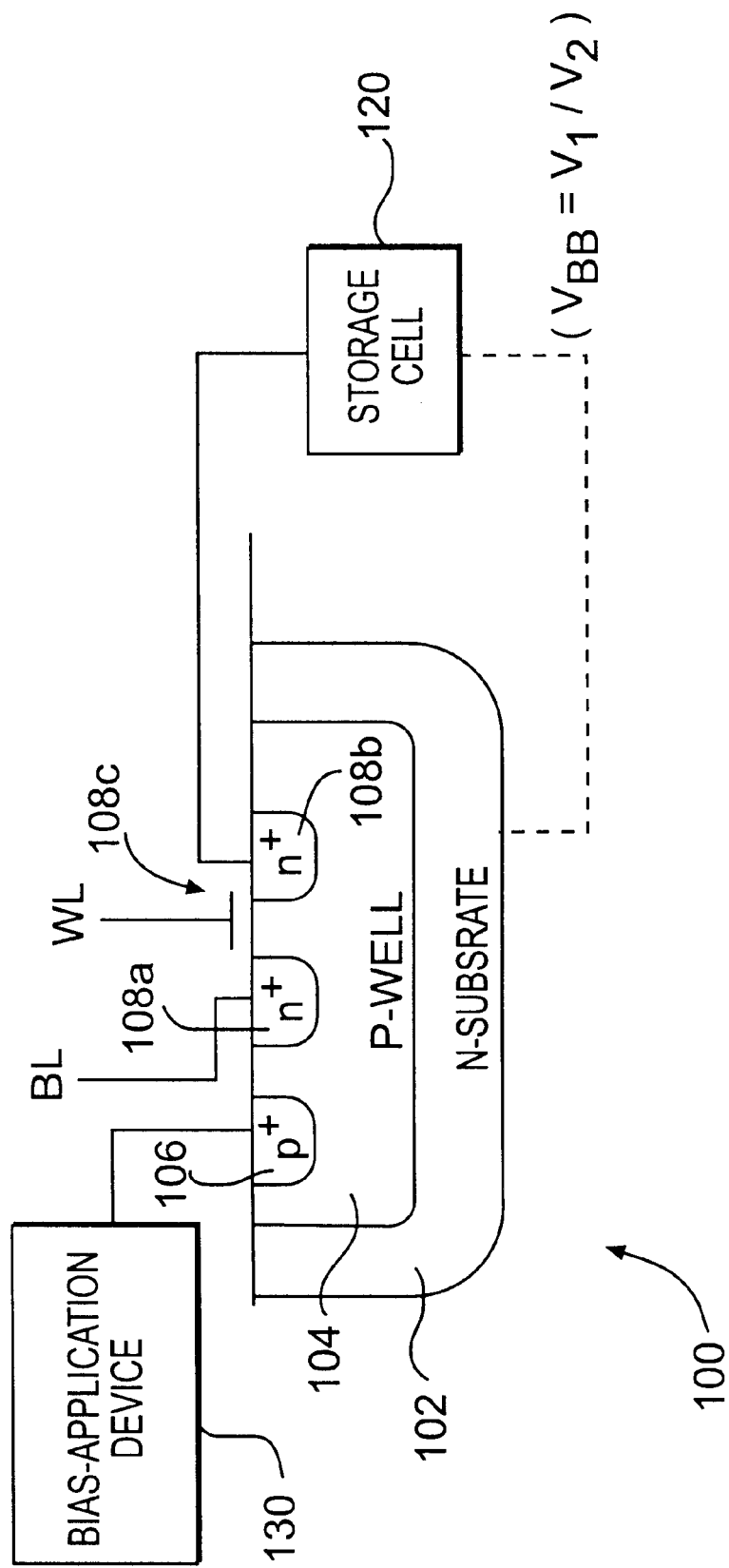
FIG. 3 shows a schematic sectional side view of a transistor and a biasing application device coupled to the transistor in accordance with the present invention.

FIG. 3 shows a schematic sectional side view of a transistor 100 coupled with a bias application device 130 in accordance with the present invention. The transistor 100 is a passing transistor coupled with a storage cell 120. The semiconductor device of the present invention includes the bias-application device 130 coupled to the substrate 102 of the passing transistor 100. In the preferred embodiments, the storage cell 120 shares the same substrate 102 with the passing transistor 100. Therefore, the bias application device 130 was also coupled to the substrate of the storage cell 120. In this illustrated example, the passing transistor 100 is an N-type metal-oxide-semiconductor field-effect transistor ("NMOSFET"). The same invention can be practiced with equal effectiveness in a P-type metal-oxide-semiconductor field-effect transistor ("PMOSFET") by changing the level and the phase of the applied bias.

In the preferred embodiments, the bias-application device 130 applies a bias voltage to the substrate 102 of the passing transistor 100. The level of the bias voltage can be fixed, or be varied with the operational status of the passing transistor 100. FIG. 3 illustrates the specific example of applying the positive bias through a p+doped region 106 to the P-well 104 within the N-substrate 102 of the passing transistor 100. In general, the typical leakage problem of a transistor occurs when the transistor is inactivated and there is less leakage concern when the transistor is activated to provide a path for an electric current. Therefore, in the preferred embodiments, the bias-application device 130 applies a first bias voltage $V_1$ of a positive value when the passing transistor 100 is inactivated or turned off, and does not apply a bias when the passing transistor 100 is activated or turned on. Alternatively, the bias-application device 130 may apply a second bias voltage $V_2$ when the passing transistor 100 is activated or turned on. For the example of using an N-type transistor, the second bias voltage $V_2$ is equal to or preferably smaller than the first bias voltage $V_1$. The relationship between the applied bias voltage and the operational status of the passing transistor 100 is illustrated with Table 1 below.

TABLE 1

The relationship between the applied bias voltage and the operational status of the passing transistor

| Transistor status | Bias voltage $V_{BB}$ | For NMOS | Preferred embodiments |
|---|---|---|---|
| Turned-off | $V_1$ | $V_1 > 0$ | $V_1 = 0.3$–$1.5$ Volts |
| Turned-on | $V_2$ | $V_2 \leq V_1$ | $V_2 \approx 0$ Volt |

In the case of a transistor operated between a first power-supply voltage of $V_{DD}$ and a second power-supply voltage of $V_{SS}$, the second bias voltage $V_2$ can be $V_{SS}$, which is approximately a ground ("GND") value of about 0 volt for most circuits. An alternative second bias voltage $V_2$ of a lower level, such as a negative bias, may be applied as well. The level of the first bias voltage $V_1$ can be varied in a great range depending on the design and the level of the supply voltage of circuits. The first bias voltage $V_1$ can be of any level between the first power-supply voltage of $V_{DD}$ and the second power-supply voltage of $V_{SS}$. The bias-application device 130 can therefore be implemented by a voltage shift circuit for generating the bias-voltage of a level between the first power-supply voltage $V_{DD}$ and the second power-supply voltage VSS. In the preferred embodiments, the first bias voltage $V_1$ is between 0.3 and 1.5 volts for a circuit using a $V_{DD}$ of about 3.3 volts and a $V_{SS}$ at a ground level. When the applied first bias voltage $V_1$ exceeds 0.6V, the passing transistor 100 is likely to have some leakage issue if the bit line voltage is about 0V. Therefore, a bit line bias of a positive value may be applied in the preferred embodiments to avoid the leakage problem. The applied bit line can be varied from 0V to the level of the first bias voltage $V_1$.

As illustrated above in the preferred embodiments, the bias-application device 130 applies a bias voltage, through a p+doped region 106, to the P-well 104 within the N-substrate 102 of the passing transistor 100. The storage cell 120 shares the same substrate 102 with the passing transistor 100. Therefore, a bias voltage $V_{BB}$ that could be $V_1$ or $V_2$ at different timing is presented in the common substrate 102. The application of a positive bias to the substrate 12 of the passing transistor 100 greatly reduces the leakage current through the passing transistor 100.

In the specific application of coupling the passing transistor 100 to a storage cell 120, the passing transistor's gate terminal 108c is coupled to a word line of a memory circuit. In the preferred embodiments, the passing transistor 100 has its drain terminal 108a coupled to a bit line of the memory circuit and has its source terminal 108b coupled to the storage cell 120. In one of the preferred embodiments of the present invention the bias voltage is applied also to the bit line of the memory circuit, or namely the drain terminal 108a, when the passing transistor 100 is inactivated. The storage cell can be any kind of storage cell that is capable of being operated with one or more passing transistors. The following illustrations provide two specific examples of coupling the passing transistor 100 with a dynamic-random-access-memory ("DRAM") storage unit, and with a static-random-access memory ("SRAM") storage unit.

Figure 4A:
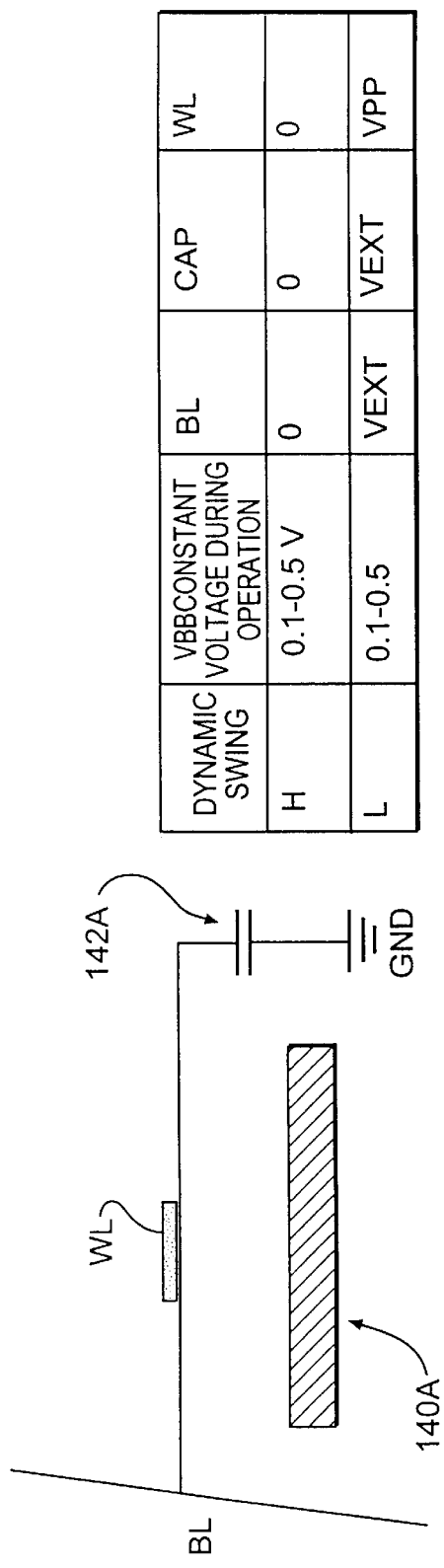
FIG. 4A illustrates a passing transistor coupled with a capacitor without the application of an external bias.
Figure 4B:
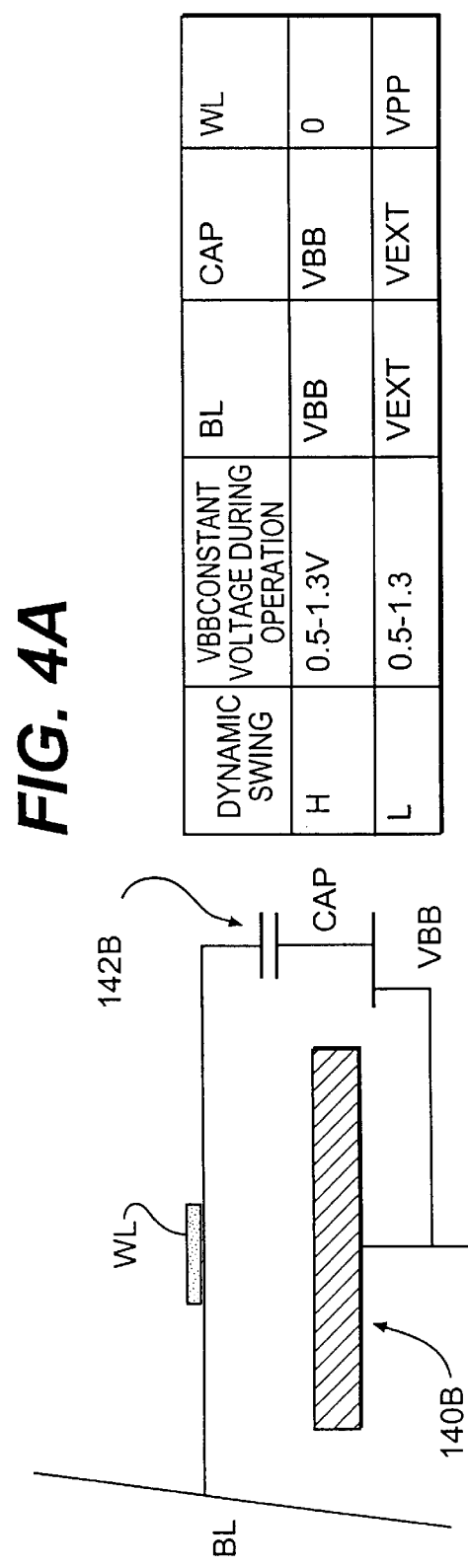
FIG. 4B illustrates a passing transistor with a bias-application device and a capacitor in accordance with the present invention.

FIG. 4A illustrates a passing transistor 140A coupled with a DRAM storage unit, capacitor 142A, without applying any external bias. In contrast, FIG. 4B illustrates a passing transistor 140B with the bias-application device 130. The passing transistor 140B is coupled with a DRAM storage unit, capacitor 142B; the bias-application device is coupled with the substrate of the passing transistor 140B and of the capacitor 142B. The following two tables lists the voltages applied to the bit line ("BL"), the substrate of the capacitor ("Cap"), and the word line ("WL") at two dynamic swing status of the DRAM cells, wherein Vext equals $V_{SS}$ and Vpp equals $V_{DD}$. The two tables are duplicated respectively in FIG. 4A and FIG. 4B.

TABLE 2A

The voltages applied to the ends of a DRAM storage unit having no bias-application device, as illustrated in FIG. 4A.

| Dynamic swing | $V_{BB}$ | BL | Cap | WL |
|---|---|---|---|---|
| H | 0.1–0.5 V | 0 | 0 | 0 |
| L | 0.1–0.5 V | Vext | Vext | Vpp |

TABLE 2B

The voltages applied to the ends of a DRAM storage unit with a bias-application device, as illustrated in FIG. 4B.

| Dynamic swing | $V_{BB}$ | BL | Cap | WL |
|---|---|---|---|---|
| H | 0.5–1.3 V | $V_{BB}$ | $V_{BB}$ | 0 |
| L | 0.5–1.3 V | Vext | Vext | Vpp |

Figure 5:
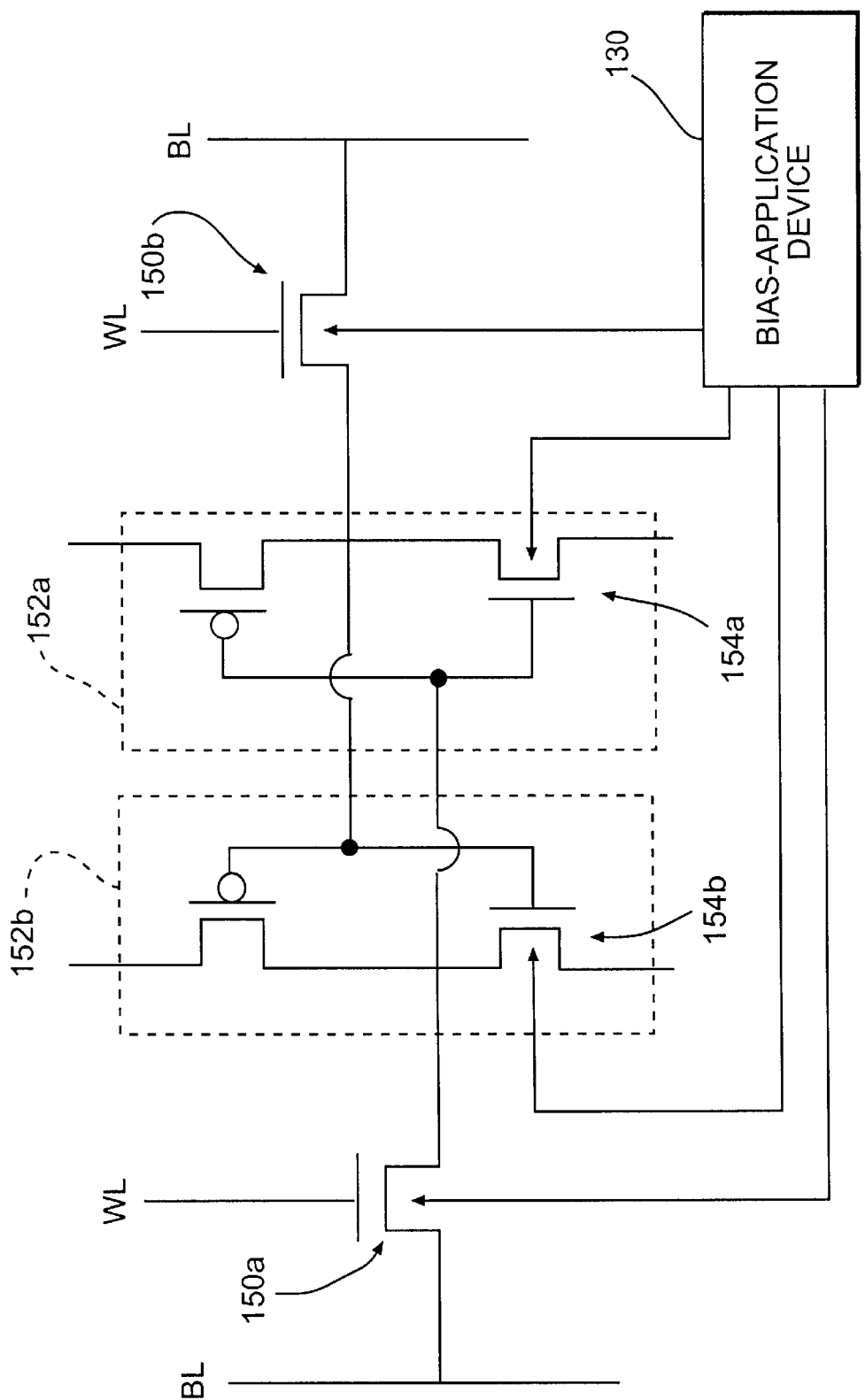
FIG. 5 illustrates the example of two passing transistors coupled with a SRAM storage unit in accordance with the present invention.

FIG. 5 illustrates the example of two passing transistors 150a and 150b coupled with a SRAM storage unit. In general, a SRAM device has two cross-coupled inverters 152a and 152b. The two cross-coupled inverters 152a and 152b each has a pulling-down N-type transistor, respectively 154a and 154b. In the preferred embodiments, the bias-application device 130 also applies a bias voltage to the substrates of pulling-down N-type transistors 154a and 154b in the SRAM storage unit. As one of the preferred embodiments, the bias-application device 130 applies the first bias voltage $V_1$ of a positive value when the passing transistors 150a, 150b, 154a, and 154b are inactivated or turned off, and does not apply a bias when the passing transistors 150a, 150b, 154a, and 154b are activated or turned on. Alternatively, the bias-application device 130 may apply a second bias voltage $V_2$ when the passing transistors 150a, 150b, 154a, and 154b are activated or turned on, wherein second bias voltage $V_2$ can be equal to or smaller than the first bias voltage $V_1$.

Accordingly, a method of operating a passing transistor 100 according to the present invention, in the application of coupling the passing transistor 100 with a storage cell 120 in FIG. 3, is to apply a positive bias voltage to the substrate of a passing transistor 100. As illustrated above in the description of the semiconductor device of the present invention, FIG. 3 illustrates a specific example of applying the positive bias through the p+ doped region 106 to the P-well 104 within the N-substrate 102 of the passing transistor 100.

In the preferred embodiments, the bias-application device 130 applies a first bias voltage $V_1$ of a positive value when the passing transistor 100 is inactivated or turned off, and does not apply a bias when the passing transistor 100 is activated or turned on. Alternatively, the bias-application device 130 may apply a second bias voltage $V_2$ when the passing transistor 100 is activated or turned on. For the example of using an N-type transistor, the first bias voltage $V_1$ is greater than the second bias voltage $V_2$. The second bias voltage $V_2$ can be Vss, which is approximately a ground value of about 0 volt for most circuits, or a bias of a lower level, such as a negative bias. The level of the first bias voltage $V_1$ can be of any level between the first power-supply voltage of $V_{DD}$ and the second power-supply voltage of $V_{SS}$. In the preferred embodiments, the first bias voltage $V_1$ is between 0.3 and 1.5 volts for a circuit using a $V_{DD}$ of about 3.3 volts and a $V_{SS}$ of a ground level.

As illustrated above, the passing transistor 100 may have its gate terminal 108c coupled to a word line of a memory circuit, its drain terminal 108a coupled to a bit line of the memory circuit, and its source terminal 108b coupled to the storage cell 120. The storage cell 120 can be any kind of storage cell that is capable of being operated with one or more passing transistors, such as a DRAM storage unit, a capacitor such as capacitor 142 as shown in FIG. 4, or a SRAM storage unit coupled with two passing transistors, such as passing transistors 150a and 150b as shown in FIG. 5. In the preferred embodiments, the bias-application device 130 also applies the positive bias voltage to the substrates of pulling-down N-type transistors 154a and 154b of the SRAM storage unit. The bias-application device 130 applies a first bias voltage $V_1$ having a positive value when the passing transistors 150a, 150b, 154a, and 154b are inactivated or turned off, and does not apply a bias when the passing transistors 150a, 150b, 154a, and 154b are activated or turned on. Alternatively, the bias-application device 130 may apply a second bias voltage $V_2$ when the passing transistors 150a, 150b, 154a, and 154b are activated or turned on.

It will be apparent to those skilled in the art that various modifications and variations can be made in the method of the present invention and in its implementation without departing from the scope or spirit of the invention. Though this invention has been described in relation to field effect transistors (FETs), it is applicable to other types of transistors having a substrate or body terminal (including all IGFETS). Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An integrated circuit comprising:
    a passing transistor including a substrate, wherein said substrate is coupled to a storage cell; and
    a bias-application device coupled to the substrate of said passing transistor for applying a first bias voltage of a positive value to the substrate when said passing transistor is inactivated and applying a second bias voltage to the substrate when said passing transistor is activated, said second bias voltage being equal to or smaller than said first bias voltage.

2. The integrated circuit of claim 1, wherein said passing transistor is an N-type transistor.

3. The integrated circuit of claim 1, wherein said second bias voltage is Vss or ground.

4. The integrated circuit of claim 1, wherein said first bias voltage is between 0.3 and 0.6 volts.

5. The integrated circuit of claim 1, wherein said passing transistor has a gate terminal coupled to a word line of a memory circuit, a drain terminal coupled to a bit line of the memory circuit, and a source terminal coupled to the storage cell.

6. The integrated circuit of claim 1, wherein said bias-application device applies the first bias voltage to the bit line of the memory circuit when said passing transistor is inactivated.

7. The integrated circuit of claim 1, wherein said storage cell is a dynamic-random-access-memory storage unit or a static-random-access memory storage unit.

8. The integrated circuit of claim 1, wherein said storage cell is a static-random-access memory storage unit and said bias-application device applies said first bias voltage and said second bias voltage to the substrate coupled to the static-random-access memory storage unit.

9. The integrated circuit of claim 1, wherein said bias-application device operates between a first power-supply voltage and a second power-supply voltage that are used for the operation of said passing transistor, said bias-application device comprises a voltage shift circuit for generating said first bias voltage and said second bias voltage of levels between the first power-supply voltage and the second power-supply voltage.

10. A method of operating a passing transistor of N-type, said passing transistor including a substrate, wherein said substrate is coupled to a storage cell, the method comprising:

applying a first bias voltage of a positive value to the substrate when said passing transistor is inactivated; and applying a second bias voltage to the substrate when said passing transistor is activated, wherein said second bias voltage is equal to or smaller than said first bias voltage.

11. The method of claim 10, wherein said second bias voltage is Vss or ground.

12. The method of claim 10, wherein said first bias voltage is between 0.3 and 0.6 volts.

13. The method of claim 10, wherein said passing transistor has a gate terminal coupled to a word line of a memory circuit, a drain terminal coupled to a bit line of the memory circuit, and a source terminal coupled to the storage cell.

14. The method of claim 10, wherein the method applies said first bias voltage to the bit line of the memory circuit when said passing transistor is inactivated.

15. The method of claim 10, wherein said storage cell is a dynamic-random-access-memory storage unit or a static-random-access memory storage unit.

16. The method of claim 10, wherein said storage cell is a static-random-access memory storage unit and the bias-application device applies said first bias voltage and said second bias voltage to the substrate coupled to the static-random-access memory storage unit.

17. The method of claim 10, wherein a bias-application device operates between a first power-supply voltage and a second power-supply voltage that are used for the operation of said passing transistor, said bias-application comprises a voltage shift circuit for generating said first bias voltage and said second bias voltage of levels between the first power-supply voltage and the second power-supply voltage.

18. An integrated circuit, comprising:

a passing transistor including a substrate, wherein said substrate is coupled to a storage cell, said passing transistor being an N-type transistor; and a bias-application device coupled to the substrate of said passing transistor and of said storage cell for applying a first bias voltage of a positive value to the substrate when said passing transistor is inactivated and applying a second bias voltage to the substrate when said passing transistor is activated, said second bias voltage being equal to or smaller than said first bias voltage.

19. The integrated circuit of claim 18, wherein said bias-application device applies the first bias voltage to a bit line of the memory circuit when said passing transistor is inactivated.

20. The integrated circuit of claim 18, wherein said storage cell is a static-random-access memory storage unit and said bias-application device applies said first bias voltage and said second bias voltage to the substrate coupled to the static-random-access memory storage unit.

* * * * *